United States Patent
Pannek et al.

(10) Patent No.: US 7,270,868 B2
(45) Date of Patent: Sep. 18, 2007

(54) MICROMECHANICAL COMPONENT

(75) Inventors: Thorsten Pannek, Stuttgart (DE); Udo Bischof, Wannweil (DE); Silvia Kronmueller, Schwaikheim (DE); Jens Frey, Filderstadt (DE); Ulf Wilhelm, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/618,791

(22) Filed: Jul. 14, 2003

(65) Prior Publication Data
US 2004/0081802 A1 Apr. 29, 2004

(30) Foreign Application Priority Data
Jul. 13, 2002 (DE) .................. 102 31 729

(51) Int. Cl.
*B32B 3/00* (2006.01)
*B32B 3/10* (2006.01)
*B32B 3/18* (2006.01)
*H01L 21/00* (2006.01)
*H01L 29/84* (2006.01)

(52) U.S. Cl. .............. 428/172; 428/174; 428/446; 438/50; 438/51; 438/53; 257/415; 257/417; 257/418; 257/419

(58) Field of Classification Search .......... 428/174, 428/446, 172; 257/415, 417, 418, 419; 438/50, 438/51, 53
See application file for complete search history.

(56) References Cited

U.S. PATENT DOCUMENTS 5,490,034 A * 2/1996 Zavracky et al. ........ 361/283.4
5,830,372 A * 11/1998 Hierold ..................... 216/2
6,199,874 B1 * 3/2001 Galvin et al. ............ 280/5.514
6,317,342 B1 * 11/2001 Noworolski et al. ......... 363/59
6,753,559 B2 * 6/2004 Chatterjee et al. ......... 257/283
6,822,304 B1 * 11/2004 Honer ....................... 257/418
6,824,278 B2 * 11/2004 Rodgers et al. ............ 359/838
2003/0001221 A1 * 1/2003 Fischer et al. ............ 257/417
2003/0141561 A1 * 7/2003 Fischer et al. ............ 257/415
2004/0065932 A1 * 4/2004 Reichenbach et al. ...... 257/415
2004/0112937 A1 * 6/2004 Laermer ..................... 228/101

FOREIGN PATENT DOCUMENTS

WO    WO 01/46066 A2 * 6/2001
WO    WO 02/38492 A1 * 5/2002

* cited by examiner

*Primary Examiner*—Alicia Chevalier
*Assistant Examiner*—Christopher P Bruenjes
(74) *Attorney, Agent, or Firm*—Kenyon & Kenyon LLP

(57) ABSTRACT

A component having a surface micromechanical structure containing both movable elements and immovable elements, and a method of manufacturing same are described. The surface micromechanical structure of the component is produced in a functional layer, which is connected to a substrate via at least one electrically non-conductive first insulation layer and at least one first sacrificial layer. The movable elements of the surface micromechanical structure are exposed by removing the first sacrificial layer. The first insulation layer is made of a material which is not substantially attacked by the process of removing the first sacrificial layer. Thus the removal of the sacrificial layer may be limited in a design-controlled manner. At the same time, a reliable electrical insulation of the surface micromechanical structure with respect to the substrate of the component and a reliable mechanical fastening of the immovable elements of the surface micromechanical structure to the substrate are ensured.

10 Claims, 3 Drawing Sheets

MICROMECHANICAL COMPONENT

FIELD OF THE INVENTION

The present invention relates to a component having a surface micromechanical structure, which includes both movable and immovable elements. The surface micromechanical structure of the component is produced in a functional layer, which is connected to a substrate via at least one electrically non-conductive first insulation layer and at least one first sacrificial layer, the movable elements of the surface micromechanical structure being exposed by removing the first sacrificial layer.

The present invention furthermore relates to a method of manufacturing such a component. For this purpose, at least one first electrically non-conductive insulation layer is applied to a substrate. At least one first sacrificial layer, onto which a functional layer is subsequently applied, is produced over the first insulation layer. The surface micromechanical structure of the component is defined in the functional layer, and the movable elements of the surface micromechanical structure are exposed by removing the first sacrificial layer.

BACKGROUND INFORMATION

Components having a surface micromechanical structure, in which both the insulation layer applied to the substrate and the sacrificial layer are implemented in the form of a silicon oxide layer, are known from industrial practice. To expose the movable elements of the surface micromechanical structure, silicon oxide is removed at least in the areas under the movable elements, an HF etching medium being typically used for this purpose. However, other portions of the component structure are usually also undercut at this time, since this etching method is a purely time-controlled, isotropic process without a design-controlled etch stop.

Components having a layer structure, such as described above, have presented problems in several aspects. Thus, it is only possible to ensure the mechanical fastening of immovable elements of the surface micromechanical structure of such a component if these elements have certain minimum dimensions, so that they are not fully undercut and thus detached from the substrate when the sacrificial layer is etched. Problems in the electrical connection of the component's functional layer may also occur. Electrodes, which are designed as immovable elements in the surface micromechanical structure, are often electrically contacted via a structured printed conductor layer situated between the insulation layer applied to the substrate and the sacrificial layer. If the insulation layer and the sacrificial layer are made of the same material, namely silicon oxide, at least the edge areas of the structured printed conductor layer are normally undercut when the sacrificial layer is etched. Contaminant particles may then easily be deposited on or embedded in these areas, causing a short-circuit to the substrate.

SUMMARY OF THE INVENTION

A concept for a design-controlled limit in removing the sacrificial layer is proposed with the present invention. The measures according to the present invention permit, at the same time, a reliable electrical insulation of the surface micromechanical structure with respect to the substrate of the component and a reliable mechanical fastening of immovable elements of the surface micromechanical structure to the substrate.

This is achieved according to the present invention by producing the insulation layer applied to the substrate from a material which is not substantially attacked by the process of removing the sacrificial layer.

It has been recognized according to the present invention that the insulation layer and the sacrificial layer have different functions both during the manufacture of the component and within the actual component function. Therefore, according to the present invention, materials having different properties are selected for the insulation layer and the sacrificial layer. The material of the insulation layer is primarily electrically insulating. The material of the sacrificial layer is easy to remove, according to the main function of the sacrificial layer, even if additional layers are applied onto the sacrificial layer and the sacrificial layer itself is only accessible via relatively small openings in these layers. It has been recognized according to the present invention that the material of the insulation layer should also be preferably resistant to the attack on the sacrificial layer. The material of the insulation layer is to be chosen, according to the present invention, as a function of the material of the sacrificial layer and the method of removal of the sacrificial layer.

Normally the sacrificial layer is removed using time-controlled isotropic etching. In this case, a design-controlled, i.e., well-defined, etch stop may be implemented using the insulation layer implemented according to the present invention. The measure according to the present invention therefore substantially contributes to manufacturing reliability. Using a design-controlled etch stop, fixed etching times need not be observed. A design-controlled etch stop also permits longer overall etching times and thus greater undercut widths in the previously defined areas. An insulation layer acting as an etch stop against the sacrificial layer etching also contributes to the miniaturization of the component, since it makes the implementation of electrically insulated fasteners of any desired size between the functional layer and the substrate possible. The minimum size is only limited by the mechanical stability of the fastener in this case.

Basically there are different options for implementing the concept according to the present invention in a component and in a method of manufacturing same.

As mentioned previously, the insulation layer is applied to a substrate. Depending on the type of the component to be manufactured, the insulation layer may first be structured before additional layers are applied. The insulation layer is to remain at least in the areas of the immovable elements to prevent these elements from detaching from the substrate when the sacrificial layer is removed. In addition, it may thus be ensured that these elements are electrically insulated with respect to the substrate, which is useful in particular in the case of electrodes.

As a rule, the sacrificial layer is also structured before additional layers are applied. The sacrificial layer is removed at least in the areas of the immovable elements, so that the functional layer in these areas may be grown directly onto a layer which is not attacked when the sacrificial layer is removed.

In the case of components of the type discussed here, there is the possibility of implementing electrodes as fixed, immovable elements in the functional layer, and to contact these electrodes via a structured printed conductor layer over the insulation layer. Therefore, in an advantageous variant of the method according to the present invention, an electro-conductive layer is applied onto the insulation layer and structured prior to applying additional layers, in particular the sacrificial layer and the functional layer. In this case, contact holes for the electrical connection of the functional layer to the structured electroconductive layer are produced when the sacrificial layer is structured; this electroconductive layer is referred to hereinafter as printed conductor layer.

In practice, components of the type discussed here are often provided with a cover membrane, which protects the surface micromechanical structure of the component. Such a cover membrane is normally fastened to the substrate via immovable elements in the functional layer. For this purpose, the surface micromechanical structure often includes support elements, which are only used for ensuring the stability required for the cover membrane. The idea according to the present invention may also be advantageously used in this context.

It is therefore proposed that at least one second insulation layer and at least one second sacrificial layer be produced over the surface micromechanical structure of the component for implementing a component according to the present invention having a cover membrane. This second sacrificial layer is then structured and, in doing so, removed at least in the area of the immovable elements of the surface micromechanical structure. At least one membrane layer is then applied over the structured second sacrificial layer and also structured. Openings are produced in the membrane layer, through which the second and, if present, also the first, sacrificial layer may be removed, so that the movable elements of the surface micromechanical structure are exposed. The material of the second insulation layer is also to be selected according to the present invention as a function of the material of the second sacrificial layer and of the method used for removing the second sacrificial layer, so that the material of the second insulation layer is not substantially attacked by the process for removal of the second sacrificial layer.

It has been found particularly advantageous if both sacrificial layers are formed from the same material. In this case both insulation layers may also be formed from one, suitably selected, material. In addition, both sacrificial layers may then be removed in a single operation.

The idea according to the present invention described above provides the possibility of fastening the cover membrane to the substrate via all immovable elements of the surface micromechanical structure of the component, in particular, also via immovable elements which are required for the component function, such as electrodes, for example. Due to the second insulation layer, which, according to the present invention, is made of an electrically insulating material which is not attacked when the second sacrificial layer is removed, these elements may be connected to the cover membrane in a purely mechanical manner, regardless of the dimensions of the immovable element. This substantially contributes to the stability of the cover membrane. Furthermore, due to the measures according to the present invention, often no purely support elements are needed in the surface micromechanical structure, which substantially contributes to the miniaturization of the component. In addition, the design of the surface micromechanical structure is thus simplified.

Just as the first insulation layer applied to the substrate, the second insulation layer may also be structured before applying any additional layers. The second insulation layer is to remain at least in the areas of the immovable elements. When the second sacrificial layer is applied to the second insulation layer thus structured and then removed in the areas of the immovable elements, the membrane layer subsequently applied may be grown directly on the second insulation layer in these areas. This produces a stable mechanical connection between the immovable elements and the membrane layer, which is not attacked even as the second sacrificial layer is removed. The second insulation layer may also electrically insulate immovable elements such as electrodes with respect to the membrane layer in a reliable manner.

The electrical connection of the surface micromechanical structure of a component according to the present invention may also be connected to a cover membrane via the membrane layer. In this case contact holes are produced in the area of the electrodes when the second insulation layer is structured. Since the second sacrificial layer is also opened in these areas, the membrane layer may be grown directly on the electrodes in this case. However, in this case openings through which the electrical connection of the electrodes to the membrane layer is electrically insulated from the other areas of the membrane layer are also produced when structuring the membrane layer.

Silicon oxide has been found to be a suitable sacrificial layer material, since it is easily removable using an HF etching medium, even after additional layers have been applied, through relatively small etching openings in these layers. Silicon nitride or silicon carbide have proven to be suitable materials for the insulation layers in conjunction with silicon oxide as the sacrificial layer material, since they are electrically insulating and also essentially resistant to HF attack. Particularly good results may be achieved with silicon nitride having a silicon content greater than 42%.

DETAILED DESCRIPTION

Figure 1:
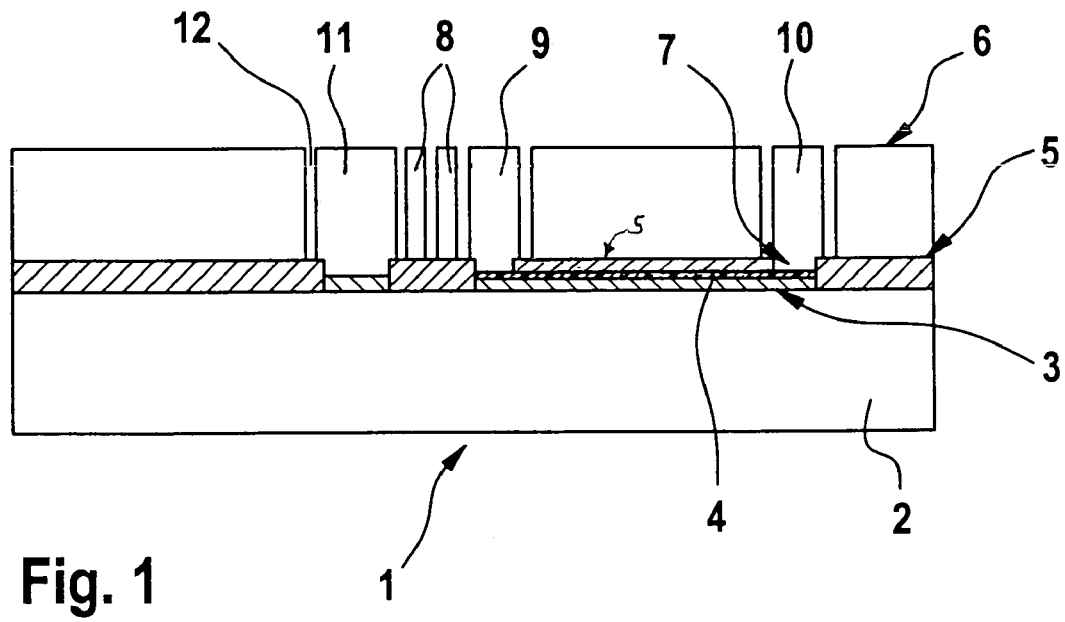
FIG. 1 shows the layer structure of a component according to the present invention prior to the removal of the sacrificial layer.
Figure 2:
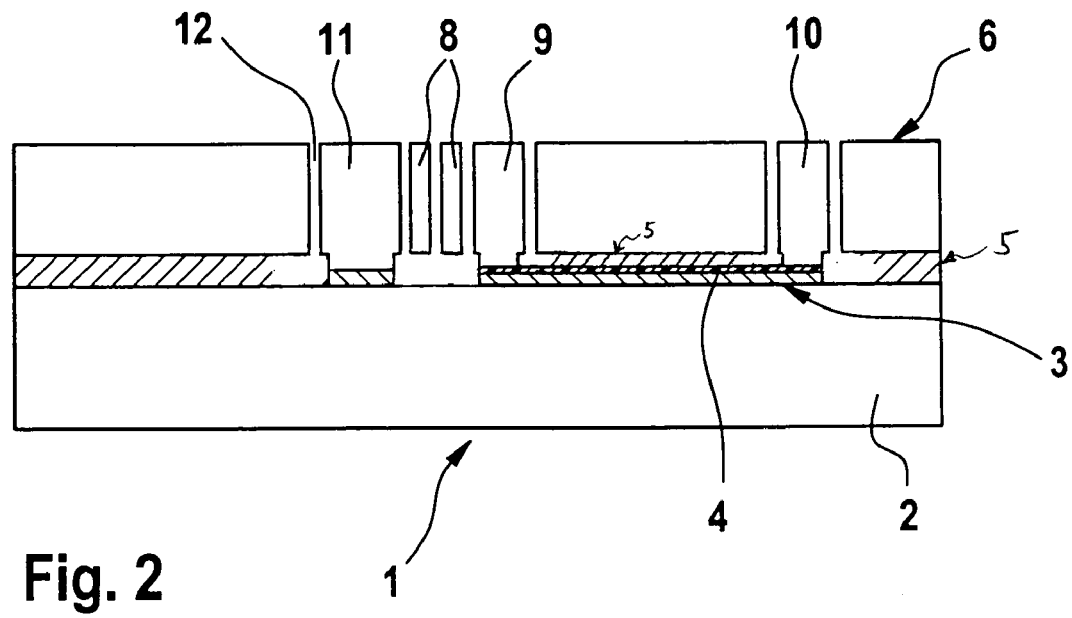
FIG. 2 shows the layer structure illustrated in FIG. 1 after removal of the sacrificial layer.

Component 1 illustrated in FIGS. 1 and 2 is a sensor element for detecting acceleration. It should again be expressly pointed out, however, that the teaching according to the present invention is not limited to the implementation of acceleration sensors, but rather refers to components in general having a surface micromechanical structure which includes both movable and immovable elements such as capacitive sensors, for example.

The layer structure of component 1 includes a substrate 2, on which a first electrically non-conductive insulation layer 3 has been produced. In the embodiment illustrated here, a silicon nitride layer having a silicon content of more than 42% has been deposited and structured as insulation layer 3. An electroconductive layer 4, made of polysilicon, was then deposited over structured insulation layer 3 and also structured. Since no connection to substrate 2 is to remain, electroconductive layer 4 may also be structured with an offset with respect to insulation layer 3. This printed conductor layer 4 is used for electrically connecting functional layer 6 of component 1 and for the external connection of the electrical leads of component 1. Printed conductor layer 4 is electrically insulated with respect to functional layer 6 by a silicon oxide layer, which is referred to hereinafter as sacrificial layer 5. An epitaxially grown polysilicon layer is used here as functional layer 6. Functional layer 6 is electrically connected in a defined manner to printed conductor layer 4 via contact holes 7 in the sacrificial layer.

Movable elements 8, which may be acted upon by an acceleration, are defined in functional layer 6. The deflections of movable elements 8 are detected by electrodes 9, which are fixedly connected to the substrate via printed conductor layer 4 and insulation layer 3.

In addition to electrodes 9, the surface micromechanical structure of component 1 created in functional layer 6 also includes additional immovable elements, namely electric terminals for component 1 in the form of bond pads 10 and fastening elements 11, which are only used for mechanically fastening the surface micromechanical structure to substrate 2. Like electrodes 9, bond pads 10 are also connected to printed conductor layer 4, while functional layer 6 is directly grown on insulation layer 3 in the area of fastening elements 11. Subsequently, insulation layer 3 has been structured here so that it remains at least in the areas of immovable elements 9, 10, and 11. In contrast, the sacrificial layer has been removed at least in the areas of immovable elements 9, 10, and 11.

Both movable elements 8 and immovable elements 9, 10, and 11 of the surface micromechanical structure have been defined by deep trenches in functional layer 6, which is illustrated in FIG. 1. This method also ensures the lateral insulation of individual electrodes 9 and allows subsequent removal of sacrificial layer 5.

FIG. 2 shows component 1 after movable elements 8 have been exposed by removing sacrificial layer 5 at least in the areas of movable elements 8. The silicon oxide of sacrificial layer 5 was removed using HF vapor here, which attacks silicon oxide via trenches 12 in functional layer 6. Since both polysilicon of functional layer 6 and printed conductor layer 4, and silicon nitride of insulation layer 3 are largely resistant to etching attack by an HF etching medium, no undercutting of either electrically connected electrodes 9 and bond pads 10, or of purely mechanically fastened elements 11 occurs.

According to the present invention, silicon-rich silicon nitride is selected as the material for insulation layer 3, since it is electrically non-conductive and the low etching rate of $Si_xNi_y$ where x>42% permits selective etching of silicon nitride with respect to silicon oxide in HF vapor. Structured insulation layer 3 thus forms a design-controlled etch stop for the sacrificial layer etching, which makes longer etching times and therefore greater undercut widths possible.

Figure 3:
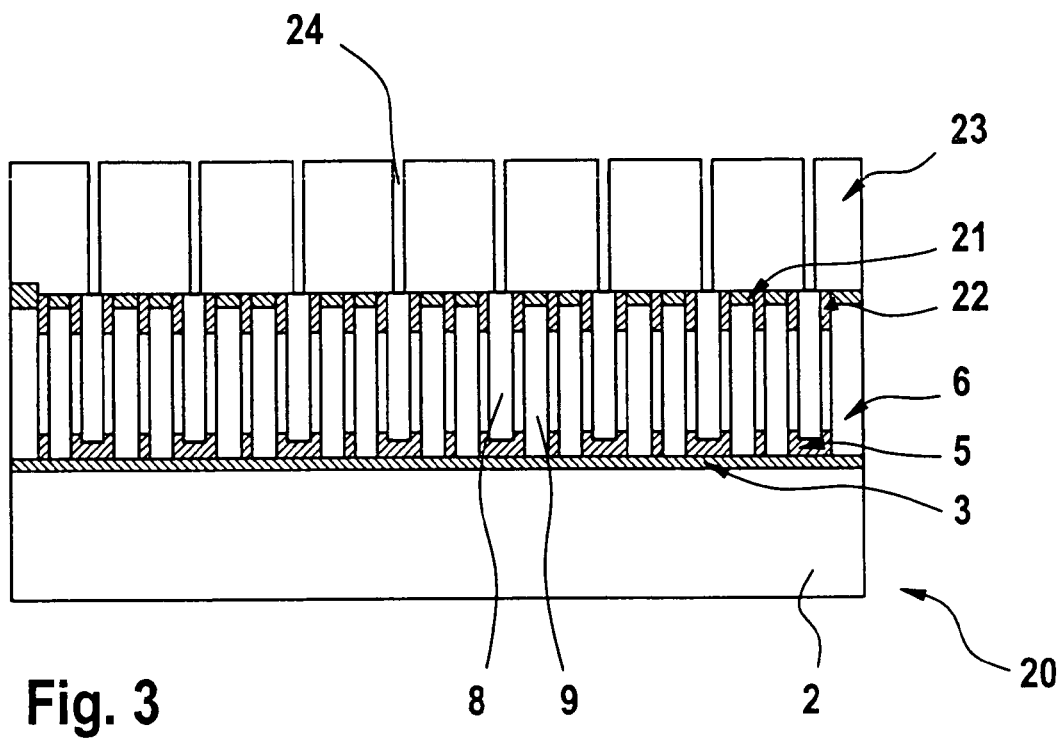
FIG. 3 shows the layer structure of another component according to the present invention having a cover membrane prior to removal of the sacrificial layers.
Figure 4:
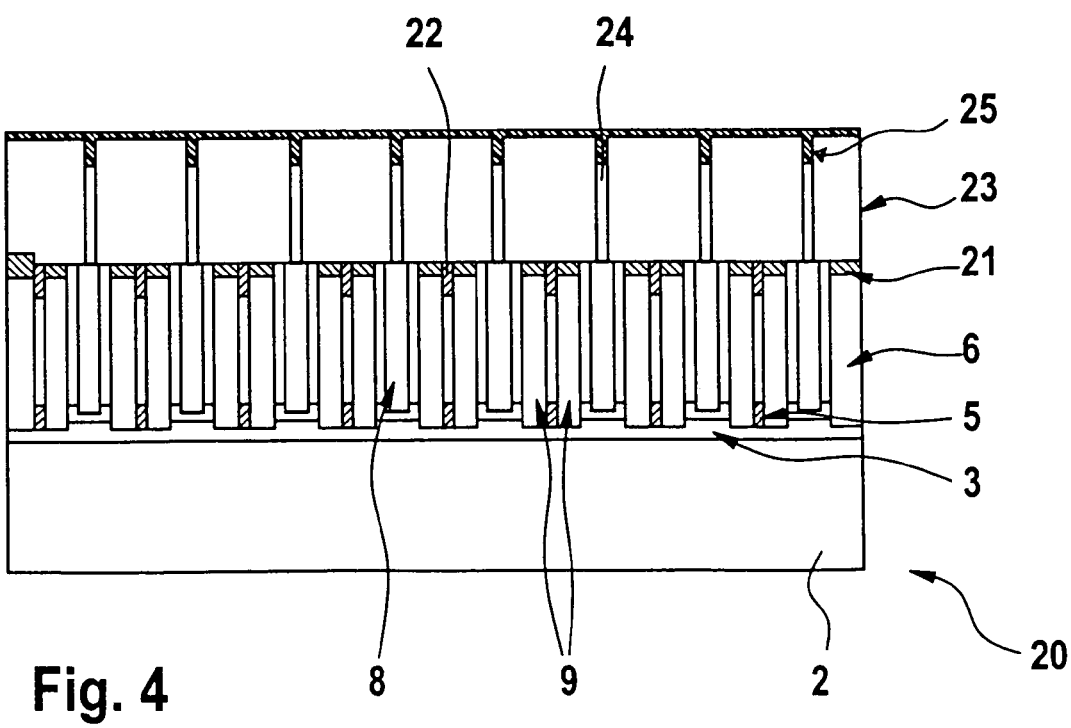
FIG. 4 shows the layer structure illustrated in FIG. 3 after removal of the sacrificial layers.

The layer structure of component 20 illustrated in FIGS. 3 and 4 also includes a substrate 2, on which a first electrically non-conductive insulation layer 3 made of silicon-rich silicon nitride has been deposited. A silicon oxide layer has been applied to insulation layer 3 as first sacrificial layer 5 and it has been structured. Functional layer 6 of component 20 has been produced over structured sacrificial layer 5 by epitaxially growing a polysilicon layer on it. Also in this case, movable elements 8, which may be acted upon by an acceleration, for example, are produced in functional layer 6. The deflections of movable elements 8 are detected by electrodes 9, which are mechanically connected to the substrate via insulation layer 3. Accordingly, sacrificial layer 5 has been removed prior to growing functional layer 6 in the areas of electrodes 9. The electric connection of functional layer 6 and, in particular, of electrodes 9 is not illustrated in FIGS. 3 and 4. Various approaches are discussed here in conjunction with FIGS. 5a and 5b.

In contrast with component 1 illustrated in FIGS. 1 and 2, in the case of component 20 illustrated in FIGS. 3 and 4 a cover membrane is produced in the form of a membrane layer 23 over the surface micromechanical structure. For this purpose, a second insulation layer 21, here also made of silicon-rich silicon nitride, has been deposited on structured functional layer 6 and then opened in the areas of movable elements 8. A second sacrificial layer 22 made of silicon oxide has been deposited over second insulation layer 21 thus structured and removed again at the time of the subsequent structuring in the areas of the immovable elements, i.e., electrodes 9. Membrane layer 23 made of polysilicon, subsequently produced epitaxially, is therefore directly grown on second insulation layer 21 in the areas of electrodes 9, while it is separated from movable elements 8 only by second sacrificial layer 22, which is illustrated in FIG. 3. Membrane layer 23 is fastened to substrate 2 via electrodes 9 here.

To expose movable elements 8 which are defined in functional layer 6 by trenches 12, both first sacrificial layer 5 and second sacrificial layer 22 are be removed. This is accomplished also in this case with the help of HF vapor, which first attacks second sacrificial layer 22 via appropriately positioned perforations 24 in membrane layer 23, and then also first sacrificial layer 5. FIG. 4 shows component 20 after sacrificial layer etching and after perforations 24 in membrane layer 23 have been closed again using sealant 25.

As mentioned previously, silicon-rich silicon nitride, which has been selected in the exemplary embodiment described here as the material for both insulation layers 3 and 21, is not substantially attacked by an HF etching medium. Therefore, during the above-described etching attack neither is membrane layer 23 detached from the electrode surface nor are electrodes 9 undercut in the area of substrate 2. Also in this case the two structured insulation layers 3 and 21 form a design-controlled etch stop for the sacrificial layer etching, which makes longer etching times and thus larger undercut widths possible. Despite their mechanical connection, electrodes 9 are electrically insulated both with respect to membrane layer 23 (via second insulation layer 21) and with respect to substrate 2 (via first insulation layer 3).

Due to the approach according to the present invention, all immovable elements of the surface micromechanical structure of a component may be used for supporting a membrane layer, regardless of their dimensions. This makes it possible to substantially improve on the stability of a cover membrane thus produced without additional, purely support elements in the surface micromechanical structure of the component. The approach according to the present invention also contributes to the miniaturization of the component.

Figure 5A:
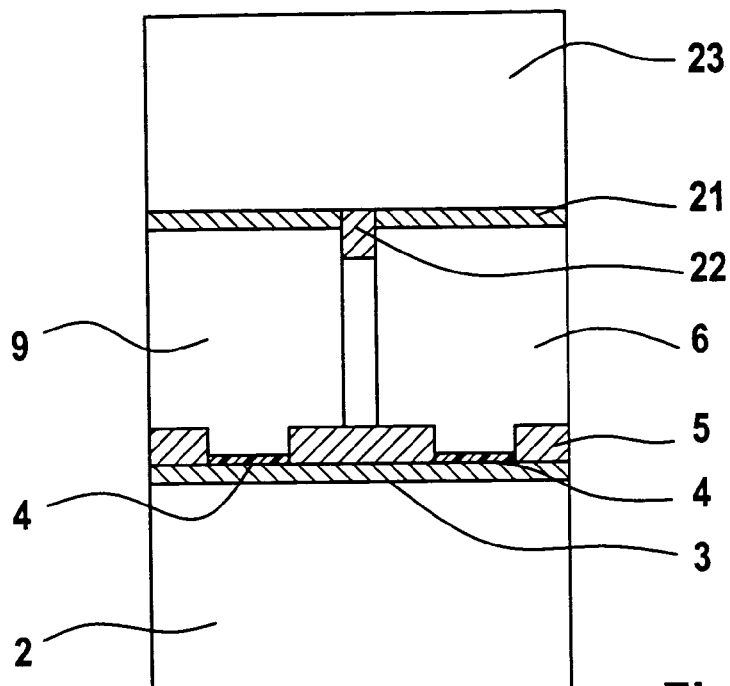
FIG. 5a shows a first option for the electrical connection of the functional layer of a component according to the present invention having a cover membrane.
Figure 5B:
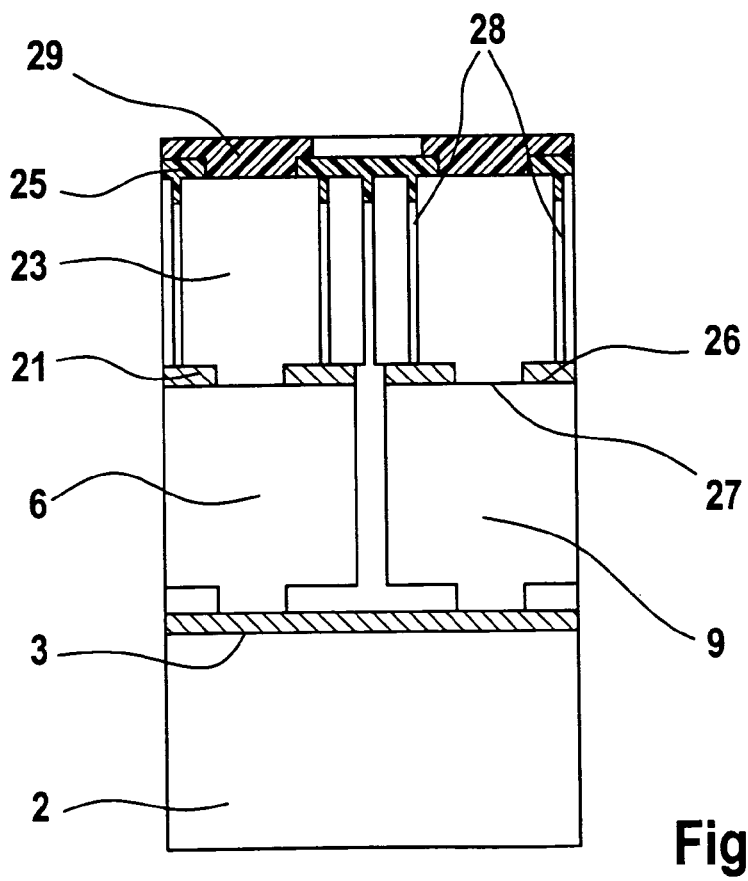
FIG. 5b shows a second option for the electrical connection of the functional layer of a component according to the present invention having a cover membrane.

FIGS. 5a and 5b show, as mentioned previously, two different options for the electrical connection of functional layer 6 of component 20 illustrated in FIGS. 3 and 4.

In the variant illustrated in FIG. 5a, the electrical connection is implemented via a printed conductor layer 4, produced between first insulation layer 3 and first sacrificial layer 5, as already described above in connection with FIGS. 1 and 2.

In contrast, the electrical connection in the variant illustrated in FIG. 5b is implemented via membrane layer 23. For this purpose, membrane layer 23 is directly connected to electrodes 9 via contact holes 26 in second insulation layer 21. These contact areas 27 of membrane layer 23 are electrically insulated from the remaining areas of membrane layer 23 by an insulation trench 28. In addition, a metallic terminal 28 is situated on membrane layer 23 in each of contact areas 27.

REFERENCE SYMBOLS

1 component
2 substrate
3 first insulation layer
4 printed conductor layer
5 first sacrificial layer
6 functional layer
7 contact hole
8 movable element
9 electrode
10 bond pad
11 fastening element
12 trench
20 component
21 second insulation layer
22 second sacrificial layer
23 membrane layer
24 perforation
25 sealant
26 contact hole
27 contact area
28 insulation trench
29 metallic terminal

What is claimed is:

1. A component, comprising:
    a functional layer;
    a surface micromechanical structure produced in the functional layer and including movable elements and immovable elements;
    at least one electrically non-conductive first insulation layer;
    at least one first sacrificial layer;
    an electroconductive layer that is structured and that is contactingly situated vertically between the at least one electrically non-conductive first insulation layer and the at least one first sacrificial layer; and
    a substrate to which is connected the functional layer via the at least one electrically non-conductive first insulation layer and the at least one first sacrificial layer,
    wherein:
        the movable elements are exposed by partially removing the at least one first sacrificial layer in the area of the movable elements,
        the at least one electrically non-conductive first insulation layer includes a material that is substantially not attacked in the removing of the at least one first sacrificial layer,
        in a first area of the immovable elements the functional layer is in direct contact with the electroconductive layer and in a second area the functional layer is in direct contact with the at least one first sacrificial layer, and
        the component is configured to perform an intended functionality of the component.

2. The component of claim 1, wherein the component comprises a sensor and the intended functionality includes sensing by the sensor.

3. The component as recited in claim 1, further comprising:
    at least one membrane layer arranged over the surface micromechanical structure, the at least one membrane layer being mechanically connected to the substrate via at least one of the immovable elements;
    at least one second sacrificial layer arranged between the functional layer and the at least one membrane layer; and
    at least one second insulation layer arranged between the at least one of the immovable elements and the at least one membrane layer, wherein:
        the movable elements are exposed by removing the at least one second sacrificial layer, and
        the at least one second insulation layer includes a material that is not substantially attacked by the removing of the at least one second sacrificial layer.

4. The component as recited in claim 3, wherein:
    the at least one electrically non-conductive first insulation layer and the at least one second insulation layer are located only in areas of the immovable elements.

5. The component as recited in claim 3, wherein:
    the at least one second sacrificial layer is removed at least in areas of the immovable elements, and
    the at least one membrane layer in the areas is in direct contact with the at least one second insulation layer.

6. The component as recited in claim 3, wherein:
    the at least one of the immovable elements includes at least one electrode, and
    the at least one electrode is electrically contactable via the at least one membrane layer in that the at least one second insulation layer has at least one contact hole in an area of the at least one electrode through which the at least one membrane layer is in direct contact with the at least one electrode.

7. The component as recited in claim 3, wherein:
    the at least one first sacrificial layer and the at least one second sacrificial layer include silicon oxide, the silicon oxide being removed using an HF etching medium, and
    the at least one electrically non-conductive first insulation layer and the at least one second insulation layer include one of silicon nitride and silicon carbide.

8. The component as recited in claim 3, wherein:
    the at least one electrically non-conductive first insulation layer and the at least one second insulation layer include silicon nitride having a silicon content greater than 42%.

9. A component, comprising:
    a functional layer;
    a surface micromechanical structure produced in the functional layer and including movable elements and immovable elements;
    at least one electrically non-conductive first insulation layer;
    at least one first sacrificial layer; and
    a substrate to which is connected the functional layer via the at least one electrically non-conductive first insulation layer and the at least one first sacrificial layer,
    wherein:
        the movable elements are exposed by partially removing the at least one first sacrificial layer in the area of the movable elements,
        the at least one electrically non-conductive first insulation layer includes a material that is substantially not attacked in the removing of the at least one first sacrificial layer, and the component includes at least one area where:
  the at least one electrically non-conductive first insulation layer is arranged over the substrate;
  a conductive layer is arranged over the at least one electrically non-conductive first insulation layer; and
  the at least one first sacrificial layer is arranged over the conductive layer,
in a first area of the immovable elements the functional layer is in direct contact with the conductive layer and in a second area the functional layer is in direct contact with the at least one first sacrificial layer, and
the component is configured to perform an intended functionality of the component.

10. The component of claim 9, wherein the component comprises a sensor and the intended functionality includes sensing by the sensor.

* * * * *